(12) United States Patent
Konno et al.

(10) Patent No.: US 7,728,379 B2
(45) Date of Patent: Jun. 1, 2010

(54) SEMICONDUCTOR DEVICE AND METHOD OF MANUFACTURING SAME

(75) Inventors: Takuya Konno, Kanagawa-ken (JP);
Yoshio Ozawa, Kanagawa-ken (JP);
Tetsuya Kai, Kanagawa-ken (JP);
Yasushi Nakasaki, Kanagawa-ken (JP);
Yuuichiro Mitani, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 240 days.

(21) Appl. No.: 11/690,428

(22) Filed: Mar. 23, 2007

(65) Prior Publication Data

US 2008/0073691 A1    Mar. 27, 2008

(30) Foreign Application Priority Data

Sep. 25, 2006    (JP) .............................. 2006-259469

(51) Int. Cl.
*H01L 29/788* (2006.01)
*H01L 29/792* (2006.01)

(52) U.S. Cl. .................. 257/325; 257/315; 257/E21.68; 257/E29.3; 257/E29.304; 257/E29.309

(58) Field of Classification Search ............ 257/E21.68, 257/E29.3, 315, E29.304, E29.309, 325
See application file for complete search history.

(56) References Cited

U.S. PATENT DOCUMENTS

2006/0145237 A1* 7/2006 Kim et al. ................... 257/314
2006/0198190 A1* 9/2006 Lue ......................... 365/185.12
2006/0237771 A1* 10/2006 Forbes et al. ................ 257/315
2007/0132010 A1* 6/2007 Bhattacharyya ............. 257/324

FOREIGN PATENT DOCUMENTS

JP    2002-261097    9/2002

* cited by examiner

Primary Examiner—Brook Kebede
Assistant Examiner—Maria Ligai
(74) Attorney, Agent, or Firm—Pearne & Gordon LLP

(57) ABSTRACT

A semiconductor device includes: a semiconductor layer; an insulating film provided on the semiconductor layer; and a charge storage layer provided on the insulating film. The semiconductor layer has a channel formation region in its surface portion. The insulating film contains silicon, germanium, and oxygen. The charge storage layer is capable of storing charge supplied from the semiconductor layer through the insulating film. A method of manufacturing a semiconductor device includes: forming a silicon oxide film on a surface of a semiconductor layer; introducing germanium into the silicon oxide film; forming an insulating film containing silicon, germanium, and oxygen by heat treatment under oxidizing atmosphere; and forming a charge storage layer on the insulating film, the charge storage layer being capable of storing charge supplied from the semiconductor layer through the insulating layer.

15 Claims, 16 Drawing Sheets

NO VOLTAGE IS APPLIED TO THE
TUNNEL INSULATING FILM 24

VOLTAGE CORRESPONDING TO REWRITE IS
APPLIED TO THE TUNNEL INSULATING FILM 24

SEMICONDUCTOR DEVICE AND METHOD OF MANUFACTURING SAME

CROSS-REFERENCE TO RELATED APPLICATIONS

This application is based upon and claims the benefit of priority from the prior Japanese Patent Application No. 2006-259469, filed on Sep. 25, 2006; the entire contents of which are incorporated herein by reference.

BACKGROUND OF THE INVENTION

1. Field of the Invention

This invention relates to a semiconductor device and a method of manufacturing same.

2. Background Art

In recent years, nonvolatile semiconductor memory devices, which allow electric bulk erase and rewrite of data and in which the written data can be held without power supply, are widely used particularly in mobile devices. Such a nonvolatile semiconductor memory device is composed of memory MOS (Metal Oxide Semiconductor) transistors, which each have a tiny floating electrode (floating gate) surrounded by an insulating film, and interconnects for data input/output. The memory device retains memory by storing electric charge in the floating electrode (e.g., JP 2002-261097A).

In a nonvolatile semiconductor memory device having floating electrodes, the potential of a control electrode is controlled to control the potential of the floating electrode through the capacitive coupling between the floating electrode and the control electrode. Here, when the semiconductor substrate is grounded, the potential Vfg of the floating electrode is expressed by the following formula using the capacitance C1 between the floating electrode and the control electrode, the capacitance C2 between the floating electrode and the semiconductor substrate, and the voltage Vcg of the control electrode:

$$Vfg = C1/(C1+C2) \times Vcg$$

where $C1/(C1+C2)$ is called the coupling ratio.

The control gate voltage, which is needed to attain a prescribed floating gate voltage required for rewrite operation, is inversely proportional to the coupling ratio.

Nonvolatile semiconductor memory devices typically require high rewrite voltage. Here, the voltage applied to the tunnel insulating film depends on the above coupling ratio. Hence a high voltage must be applied to the control electrode. As the device structure is further downscaled in the future, a parasite capacitance $\alpha$ occurs in relation to the adjacent cell and decreases the coupling ratio as expressed by:

$$Vfg = C1/(C1+C2+\alpha) \times Vcg$$

which requires an even higher voltage to be applied to the control electrode. However, attaining the prescribed floating gate voltage required for rewrite operation simply by increasing the control gate voltage accelerates the deterioration of insulating film, and causes concern about insulation breakdown, the increase of leak current, and the decrease of reliability. To prevent this, the rewrite voltage and/or erase voltage must be reduced by increasing the charge injection efficiency and/or charge ejection efficiency of the tunnel insulating film.

SUMMARY OF THE INVENTION

According to an aspect of the invention, there is provided a semiconductor device including: a semiconductor layer having a channel formation region in its surface portion; an insulating film provided on the semiconductor layer and containing silicon, germanium, and oxygen; and a charge storage layer provided on the insulating film and being capable of storing charge supplied from the semiconductor layer through the insulating film.

According to another aspect of the invention, there is provided a method of manufacturing a semiconductor device including: forming a silicon oxide film on a surface of a semiconductor layer; introducing germanium into the silicon oxide film; forming an insulating film containing silicon, germanium, and oxygen by heat treatment under oxidizing atmosphere; and forming a charge storage layer on the insulating film, the charge storage layer being capable of storing charge supplied from the semiconductor layer through the insulating layer.

According to another aspect of the invention, there is provided a method of manufacturing a semiconductor device including: forming an insulating film containing silicon, germanium, and oxygen on a semiconductor layer by chemical vapor deposition, atomic layer deposition, or molecular layer deposition; and forming a charge storage layer on the insulating film, the charge storage layer being capable of storing charge supplied from the semiconductor layer through the insulating film.

DETAILED DESCRIPTION OF THE INVENTION

Figure 1:
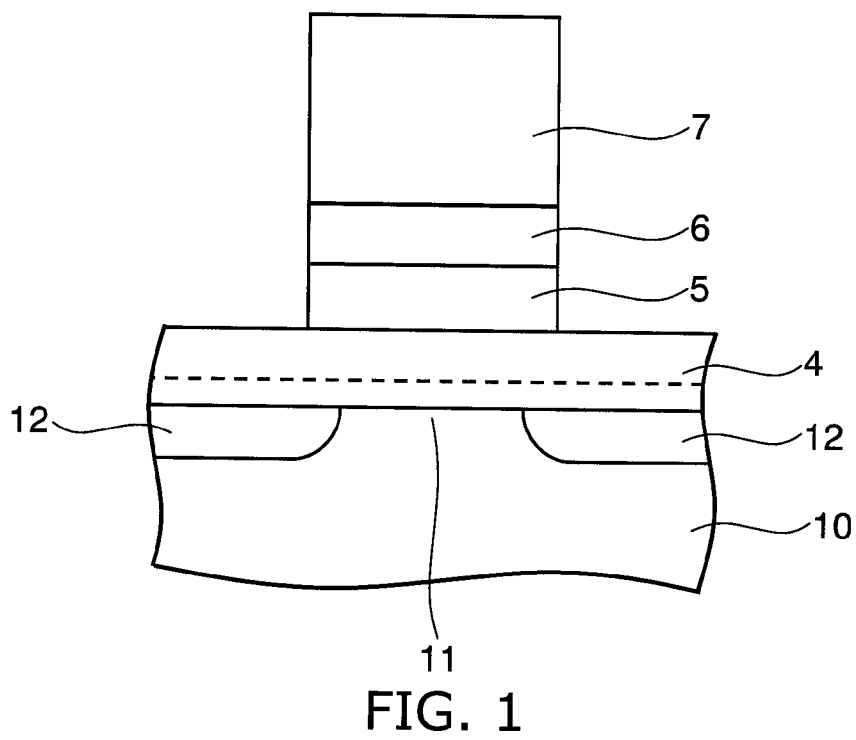
FIG. 1 is a schematic cross-sectional view illustrating the cross-sectional structure along the bit line of the main part of a nonvolatile semiconductor memory device according to a first embodiment of the invention.

Embodiments of the invention will now be described with reference to the drawings, where like components are marked with like reference numerals.

First Embodiment

FIG. 1 is a schematic cross-sectional view illustrating the cross-sectional structure along the bit line of the main part of a nonvolatile semiconductor memory device, which is a semiconductor device according to a first embodiment of the invention.

Figure 2:
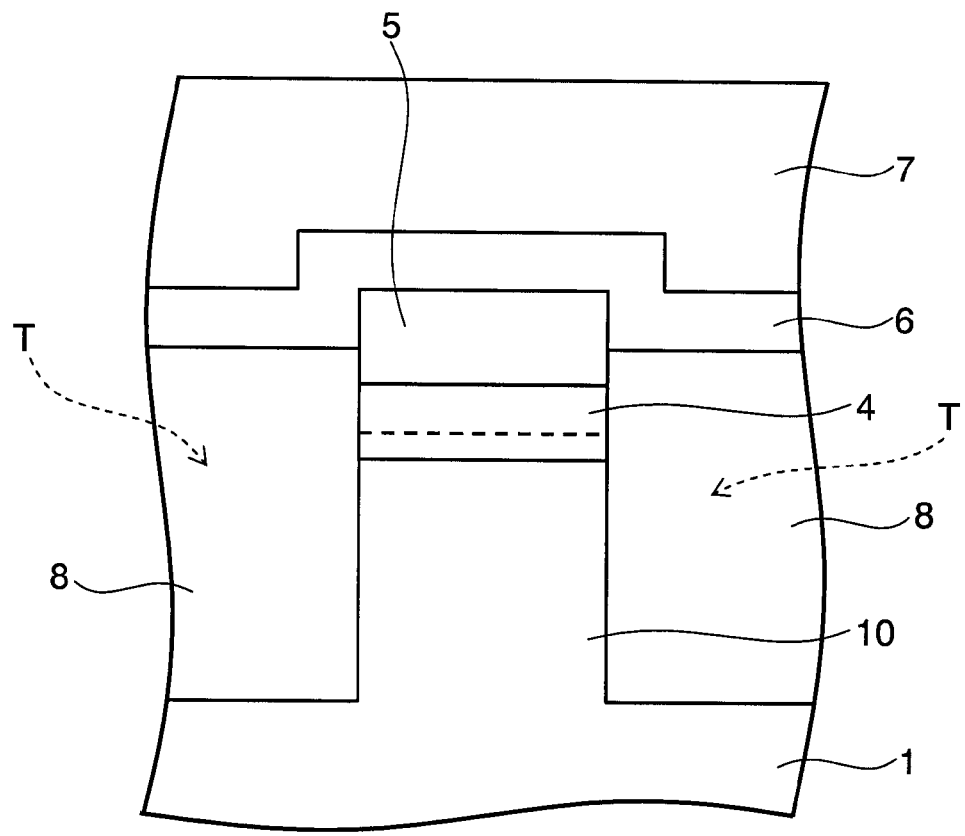
FIG. 2 is a schematic cross-sectional view illustrating the cross-sectional structure along the word line of the main part of the nonvolatile semiconductor memory device.

FIG. 2 is a schematic cross-sectional view illustrating the cross-sectional structure along the word line of the main part of the nonvolatile semiconductor memory device.

The nonvolatile semiconductor memory device according to this embodiment comprises a semiconductor layer 10, a tunnel insulating film 4 provided on the semiconductor layer 10, a floating electrode (floating gate) 5 provided on the tunnel insulating film 4, an insulating film 6 provided on the floating electrode 5, and a control electrode (control gate) 7 provided on the insulating film 6.

The semiconductor layer 10 is insulatively isolated from its adjacent semiconductor layer 10 along the word line by the STI (Shallow Trench Isolation) structure, for example. More specifically, as shown in FIG. 2, semiconductor layers 10 adjacent to each other along the word line are insulatively isolated by a trench T formed in a semiconductor substrate (e.g. silicon substrate) 1 and a device isolation insulating layer 8 buried in the trench T. The device isolation insulating layer 8 is illustratively made of silicon oxide.

As shown in FIG. 1, a dopant diffusion region (source/drain region) 12 is selectively formed in the surface portion of the semiconductor layer 10. The semiconductor layer 10 is illustratively made of p-type silicon, and the dopant diffusion region 12 is illustratively made of n-type silicon. The p-type region sandwiched between a pair of dopant diffusion regions 12 functions as a channel formation region 11.

The floating electrode 5 is illustratively made of polycrystalline silicon. The floating electrode 5 functions as a charge storage layer capable of storing charge supplied from the semiconductor layer 10 through the tunnel insulating film 4.

The periphery of the floating electrode 5 is surrounded by the tunnel insulating film 4, the device isolation insulating layer 8, and the insulating film 6, and is electrically connected to nowhere. Hence, even if the power is turned off after electrons are electrically injected into or ejected out of the floating electrode 5, the electrons in the floating electrode 5 do not leak out of the floating electrode 5, nor any electrons newly enter the floating electrode 5. That is, nonvolatility is achieved.

The tunnel insulating film 4 contains silicon, germanium, and oxygen. Specifically, the tunnel insulating film 4 has a structure where germanium is bonded to oxygen in a silicon oxide film.

In the example shown in FIGS. 1 and 2, germanium in the tunnel insulating film 4 distributes in a neighborhood of the interface between the semiconductor layer 10 and the tunnel insulating film 4. The tunnel insulating film 4 has a total thickness of e.g. 10 nm. In the tunnel insulating film 4, germanium distributes in a region within e.g. 4 nm from the interface between the semiconductor layer 10 and the tunnel insulating film 4. The germanium element concentration in the tunnel insulating film 4 is maximized at a position of e.g. 4 nm (the position indicated by the dashed line in FIGS. 1 and 2) from the interface between the semiconductor layer 10 and the tunnel insulating film 4. The maximum germanium element concentration is illustratively $10^{20}/cm^3$.

An example method of forming the tunnel insulating film 4 is now described.

First, a silicon oxide film having a thickness of about 10 nm is formed on the semiconductor layer 10 by thermal oxidation, for example. Subsequently, germanium is introduced into the silicon oxide film by ion implantation, for example. Here, the ion implantation energy is controlled so that the germanium element concentration immediately after introduction is maximized at 4 nm from the interface between the semiconductor layer 10 and the tunnel insulating film 4. After the introduction of germanium into the silicon oxide film, the silicon oxide film is heat treated under oxidizing atmosphere, for example. This results in a tunnel insulating film 4 containing silicon, germanium, and oxygen.

The inventors performed electronic state (band) simulation calculation on the tunnel insulating film 4 having the above structure, and found that charge trap levels (charge assist levels), which are shallow energy levels produced by germanium, exist at 0.5 to 1.0 eV below the conduction band in the bandgap of the silicon oxide film.

More specifically, levels assisting the migration of electrons injected from the semiconductor layer 10 side exist in a neighborhood of the interface in the tunnel insulating film 4 between the semiconductor layer 10 and the tunnel insulating film 4. These levels enhance, at data write time, the injection efficiency of electrons injected from the semiconductor layer 10 side through the tunnel insulating film 4 into the floating electrode 5. According to the simulation performed by the inventors, the structure of the present example can increase the tunnel current density by about one or two orders of magnitude relative to the case of only a silicon oxide film containing no germanium, and the write electric field can be accordingly reduced by 1 MV/cm or more. Because the electric field applied to the insulating films 4 and 6 can be reduced, insulation breakdown and leak current can be prevented, and reliability can be enhanced.

The above-described charge trap levels, which are shallow energy levels produced by germanium, do not act as assist levels for electron migration during application of low electric field at data read time, and does not impair the charge holding characteristics.

The value of electric field and the increase of current density can be controlled for enhancing the charge injection efficiency by controlling the position and the value of maximum germanium element concentration in the tunnel insulating film 4.

When the germanium element concentration is controlled to be maximized at 1 nm from the interface between the semiconductor layer 10 and the tunnel insulating film 4, the charge injection efficiency is enhanced for a write electric field of about 12 MV/cm or more. When the germanium element concentration is controlled to be maximized at 4 nm from the interface between the semiconductor layer 10 and the tunnel insulating film 4, the charge injection efficiency is enhanced for about 8 MV/cm or more.

The maximum germanium element concentration in the tunnel insulating film 4 is configured within a range selected for avoiding leak current. When the maximum germanium element concentration in the tunnel insulating film 4 is $10^{21}/cm^3$, as compared with the case where the maximum germanium element concentration is $10^{20}/cm^3$, the number of assist levels increases, and the current density increases by two or three orders of magnitude. When the maximum germanium element concentration in the tunnel insulating film 4 is $10^{19}/cm^3$, as compared with the case where the maximum germanium element concentration is $10^{20}/cm^3$, the number of assist levels decreases, and the increase of current density is by about one order of magnitude.

Alternatively, the structure may be configured so that germanium in the tunnel insulating film 4 distributes in a neighborhood of the interface between the tunnel insulating film 4 and the floating electrode 5, e.g. in a region within 4 nm from the interface.

In this case, charge trap levels (charge assist levels), which are shallow energy levels produced by germanium, exist in a neighborhood of the interface in the tunnel insulating film 4 between the tunnel insulating film 4 and the floating electrode 5. This results in the increase, at data erase time, of electron injection (ejection) efficiency for electrons injected (ejected) from the floating electrode 5 side through the tunnel insulating film 4 into the semiconductor layer 10. Hence the tunnel current density increases by about one or two orders of magnitude relative to the case of only a silicon oxide film containing no germanium, and the erase electric field can be accordingly reduced by 1 MV/cm or more.

Furthermore, the structure may be configured so that germanium in the tunnel insulating film 4 distributes both in a neighborhood of the interface between the semiconductor layer 10 and the tunnel insulating film 4 (e.g. in a region within 4 nm from the interface) and in a neighborhood of the interface between the tunnel insulating film 4 and the floating electrode 5 (e.g. in a region within 4 nm from the interface).

In this case, charge trap levels (charge assist levels), which are shallow energy levels produced by germanium, exist in a neighborhood of the interface in the tunnel insulating film 4 between the semiconductor layer 10 and the tunnel insulating film 4 and in a neighborhood of the interface in the tunnel insulating film 4 between the tunnel insulating film 4 and the floating electrode 5. As a result, the tunnel current density increases by about one or two orders of magnitude relative to the case of only a silicon oxide film containing no germanium, and the write electric field and erase electric field can be accordingly reduced by 1 MV/cm or more.

In the tunnel insulating film 4, the germanium atom is bonded to oxygen atoms. In the structure of four oxygen atoms bonded to one germanium atom, germanium in the tunnel insulating film 4 is stable. Thus threshold variation or other characteristics variations can be avoided at the time of write and/or erase operations.

In the structure of three or less oxygen atoms bonded to one germanium atom, as compared with the structure of four oxygen atoms bonded to one germanium atom, the above charge assist level is shallowed by about 0.3 eV, and the leak current density during low voltage application can be reduced by about 0.5 to 1 order of magnitude, thereby being superior in charge holding characteristics.

Figure 3:
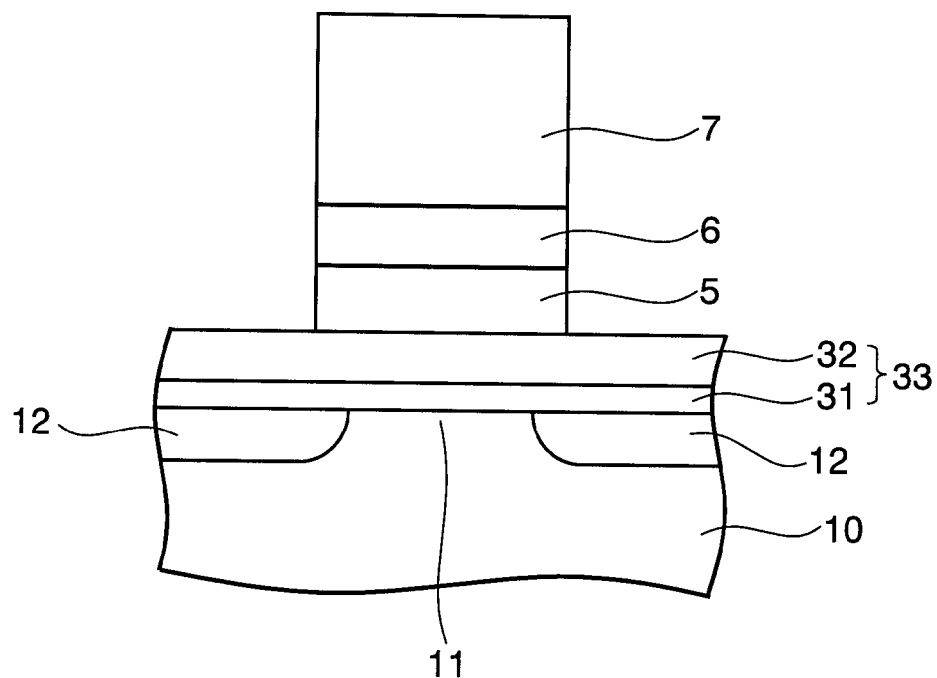
FIG. 3 shows another example of the tunnel insulating film of the nonvolatile semiconductor memory device.

FIG. 3 shows another example of the tunnel insulating film.

The tunnel insulating film 33 in this example comprises a first insulating layer 31 and a second insulating layer 32 provided on the first insulating layer 31. The first insulating layer 31 contains silicon, germanium, and oxygen. The second insulating layer 32 is illustratively made of silicon nitride or a high dielectric material having a higher dielectric constant than silicon nitride.

In this case, charge trap levels (charge assist levels), which are shallow energy levels produced by germanium, exist in a neighborhood of the interface in the tunnel insulating film 33 between the semiconductor layer 10 and the first insulating layer 31. This results in the increase of electron injection efficiency at data write time.

Furthermore, in this example, the tunnel insulating film 33 is partially (in the second insulating layer 32) made of silicon nitride or a material having a higher dielectric constant than silicon nitride. Hence, as compared with the case where silicon oxide film is interposed between the first insulating layer 31 and the floating electrode 5, the leak current at about 5.0 MV/cm is reduced by about 0.5 orders of magnitude, thereby enhancing the charge holding characteristics.

Alternatively, the first insulating layer 31 may be provided on the side of the interface between the tunnel insulating film 33 and the floating electrode 5, and the second insulating layer 32 may be provided between the first insulating layer 31 and the semiconductor layer 10. In this case, charge trap levels (charge assist levels), which are shallow energy levels produced by germanium, exist in a neighborhood of the interface in the tunnel insulating film 33 between the tunnel insulating film 33 and the floating electrode 5. This results in the increase of electron injection (ejection) efficiency at data erase time. Furthermore, the tunnel insulating film 33 is partially (in the second insulating layer 32) made of silicon nitride or a material having a higher dielectric constant than silicon nitride. Hence, as compared with the case where silicon oxide film is interposed between the first insulating layer 31 and the semiconductor layer 10, the leak current at about 5.0 MV/cm is reduced by about 0.5 orders of magnitude, thereby enhancing the charge holding characteristics.

Figure 4:
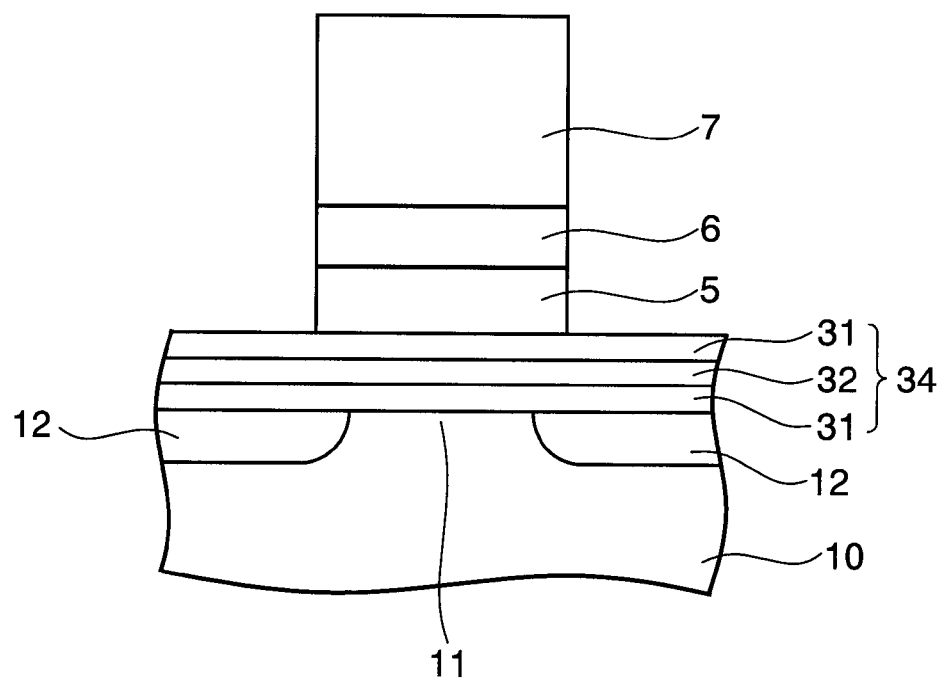
FIG. 4 shows still another example of the tunnel insulating film of the nonvolatile semiconductor memory device.

FIG. 4 shows still another example of the tunnel insulating film.

The tunnel insulating film 34 in this example has a laminated structure where a second insulating layer 32 is sandwiched between two first insulating layers 31 in the thickness direction. The first insulating layer 31 contains silicon, germanium, and oxygen. The second insulating layer 32 is illustratively made of silicon nitride or a high dielectric material having a higher dielectric constant than silicon nitride.

Charge trap levels (charge assist levels), which are shallow energy levels produced by germanium, exist both in a neighborhood of the interface in the tunnel insulating film 34 between the semiconductor layer 10 and the tunnel insulating film 34 and in a neighborhood of the interface in the tunnel insulating film 34 between the tunnel insulating film 34 and the floating electrode 5. This results in the increase of electron injection (ejection) efficiency at data write time and erase time. Furthermore, the tunnel insulating film 34 is partially (in the second insulating layer 32) made of silicon nitride or a material having a higher dielectric constant than silicon nitride. Hence, as compared with the case of using silicon oxide film, the leak current at about 5.0 MV/cm is reduced by about 0.5 orders of magnitude, thereby enhancing the charge holding characteristics.

Second Embodiment

Figure 5:
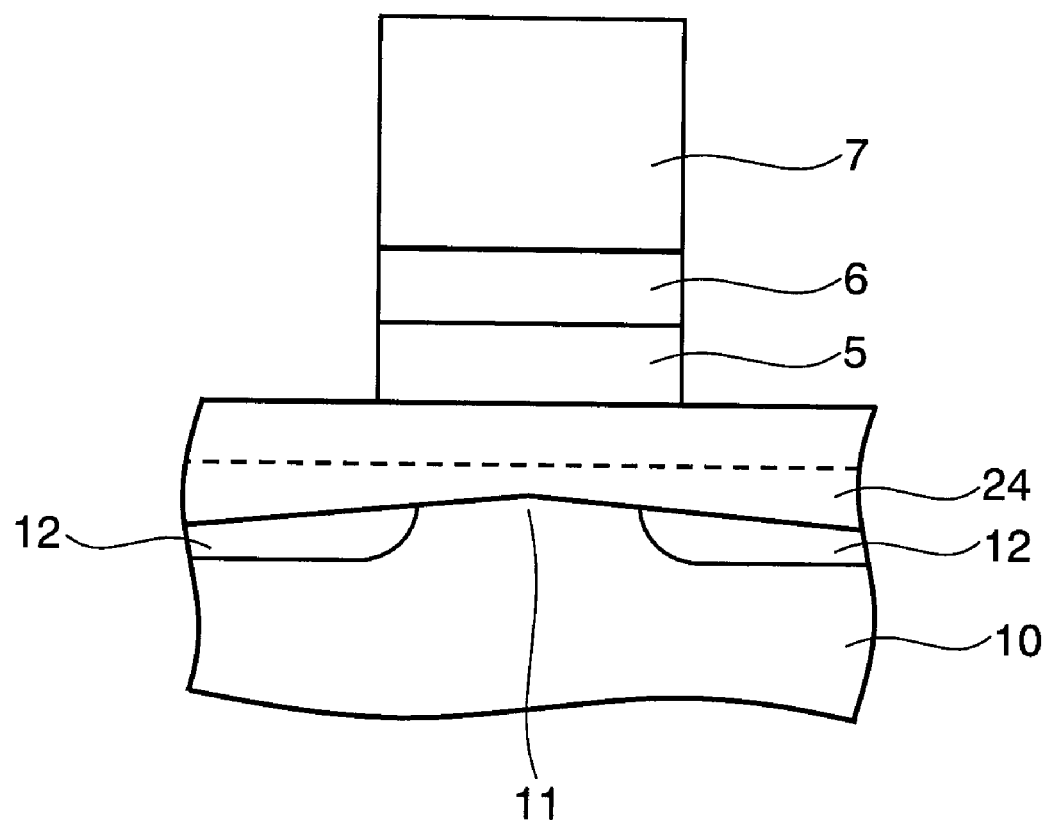
FIG. 5 is a schematic cross-sectional view illustrating the cross-sectional structure along the bit line of the main part of a nonvolatile semiconductor memory device according to a second embodiment of the invention.

FIG. 5 is a schematic cross-sectional view illustrating the cross-sectional structure along the bit line of the main part of a nonvolatile semiconductor memory device according to a second embodiment of the invention.

Also in this embodiment, as in the first embodiment, the tunnel insulating film 24 contains silicon, germanium, and oxygen. Germanium in the tunnel insulating film 24 distributes in a neighborhood of the interface between the semiconductor layer 10 and the tunnel insulating film 24.

The concentration of germanium element in the tunnel insulating film 24 decreases from the center toward the edge (dopant diffusion region 12) of the channel formation region 11. For example, at the position of maximum germanium element concentration in the tunnel insulating film 24 (the position indicated by the dashed line in FIG. 5), the germanium element concentration is $10^{21}/cm^3$ above the center of the channel formation region 11 and $10^{20}/cm^3$ above the edge (dopant diffusion region 12) of the channel formation region 11.

The distance from the interface between the semiconductor layer 10 and the tunnel insulating film 24 to the position of maximum germanium element concentration in the tunnel insulating film 24 (the position indicated by the dashed line in FIG. 5) increases from the center toward the edge (dopant diffusion region 12) of the channel formation region 11. For example, the distance from the interface between the semiconductor layer 10 and the tunnel insulating film 24 at the center of the channel formation region 11 to the position of maximum germanium element concentration in the tunnel insulating film 24 is 2 nm. The distance from the interface between the semiconductor layer 10 and the tunnel insulating film 24 at the edge (dopant diffusion region 12) of the channel formation region 11 to the position of maximum germanium element concentration in the tunnel insulating film 24 is 3 nm.

Figure 6A:
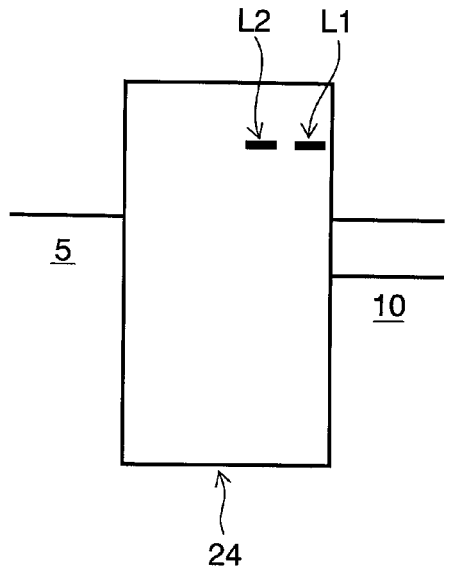
FIG. 6A is an energy band structure diagram for the structure shown in FIG. 5 where no voltage is applied to the tunnel insulating film.

FIG. 6A is an energy band structure diagram for the structure shown in FIG. 5 where no voltage is applied to the tunnel insulating film 24.

The charge trap level (charge assist level) L2, which is a shallow energy levels produced by germanium in the tunnel insulating film 24 in the neighborhood of the interface between the edge (dopant diffusion region 12) of the channel formation region 11 and the tunnel insulating film 24, is more distant from the interface between the semiconductor layer 10 and the tunnel insulating film 24 than the charge trap level (charge assist level) L1, which is a shallow energy levels produced by germanium in the tunnel insulating film 24 in the neighborhood of the interface between the center of the channel formation region 11 and the tunnel insulating film 24.

Figure 6B:
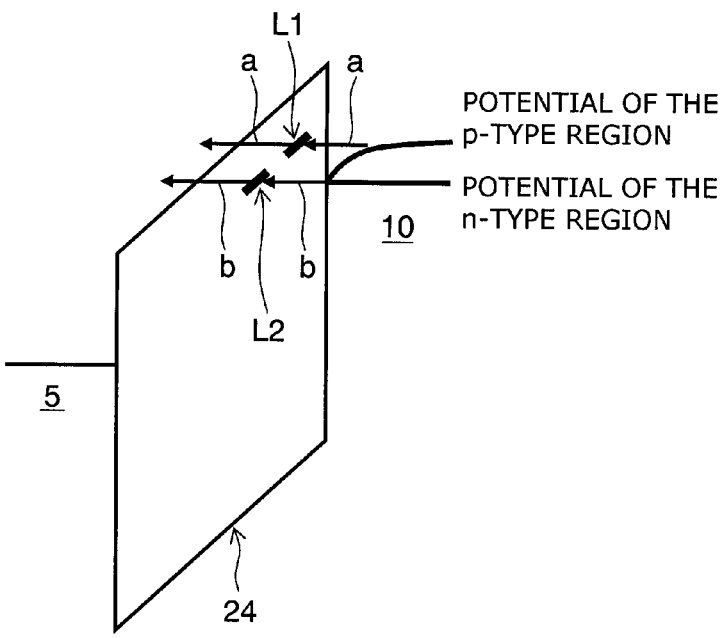
FIG. 6B is an energy band structure diagram where a voltage corresponding to the rewrite voltage is applied to the tunnel insulating film.

FIG. 6B shows an energy band structure that occurs when a voltage corresponding to the rewrite voltage is applied to the tunnel insulating film 24. The migration path of electrons injected from the center of the channel formation region 11 (p-type silicon region) through the tunnel insulating film 24 into the floating electrode 5 is indicated by the arrow a. The migration path of electrons injected from the edge of the channel formation region 11 (n-type silicon region) through the tunnel insulating film 24 into the floating electrode 5 is indicated by the arrow b.

In the band structure occurring upon application of the rewrite voltage to the tunnel insulating film 24, electrons at the center of the channel formation region 11 (p-type silicon region) become easier to migrate to the floating electrode 5 through the assist level L1, which is approximately equal to the potential of the center of the channel formation region 11 (p-type silicon region), and electrons at the edge (dopant diffusion region 12) of the channel formation region 11 become easier to migrate to the floating electrode 5 through the assist level L2, which is approximately equal to the potential of the edge (dopant diffusion region 12) of the channel formation region 11. Hence the electron injection efficiency is enhanced at both the center and the edge of the channel formation region 11. Consequently, the tunnel current density can be increased, the write electric field can be accordingly reduced, and reliability can be enhanced.

Furthermore, the germanium element concentration in the tunnel insulating film 24 in the neighborhood of the interface between the edge (dopant diffusion region 12) of the channel formation region 11 and the tunnel insulating film 24 is lower than the germanium element concentration in the tunnel insulating film 24 in the neighborhood of the interface between the center of the channel formation region 11 and the tunnel insulating film 24. Hence electron trap at the edge of the channel formation region prone to electric field concentration can be reduced at write time, and reliability can be enhanced.

Next, an example method of manufacturing a nonvolatile semiconductor memory device according to this embodiment is described. FIGS. 7 to 9 are process cross-sectional views illustrating the main part of a process of manufacturing the nonvolatile semiconductor memory device according to this embodiment.

Figure 7A:
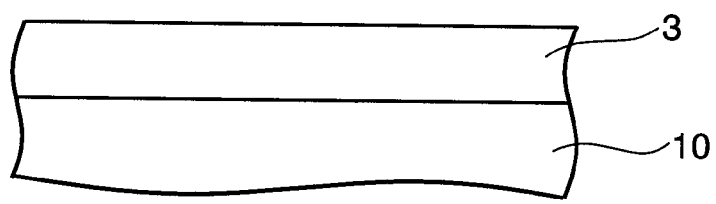
FIGS. 7 to 9 are process cross-sectional views illustrating the main part of a process of manufacturing the nonvolatile semiconductor memory device.
Figure 7B:
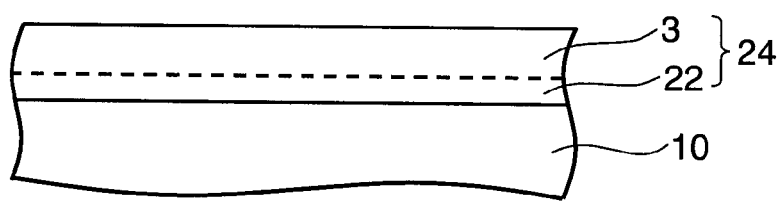

As shown in FIG. 7A, a silicon oxide film 3 of about 10 nm is formed on a semiconductor layer 10 of p-type silicon by thermal oxidation, for example. Then, as shown in FIG. 7B, germanium is introduced into the silicon oxide film 3 by ion implantation, for example. The ion implantation energy is controlled so that the distribution of germanium immediately after introduction into the silicon oxide film 3 has a maximum concentration in a range within 4 nm from the interface between the semiconductor layer 10 and the silicon oxide film 3.

Next, germanium in the silicon oxide film 3 is oxidized by heat treatment under oxidizing atmosphere. Thus a tunnel insulating film 24 having a region 22 containing silicon, germanium, and oxygen is produced in the silicon oxide film 3.

Figure 8A:
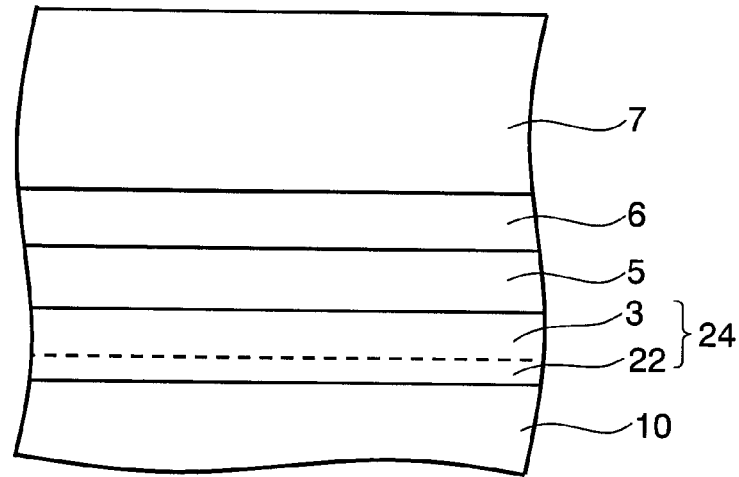

Then, as shown in FIG. 8A, a floating electrode 5, an insulating film 6, and a control electrode 7 are formed sequentially on the tunnel insulating film 24. The floating electrode 5 and the control electrode 7 are illustratively made of silicon doped with phosphorus. The insulating film 6 is illustratively made of silicon nitride or silicon oxide.

Figure 8B:
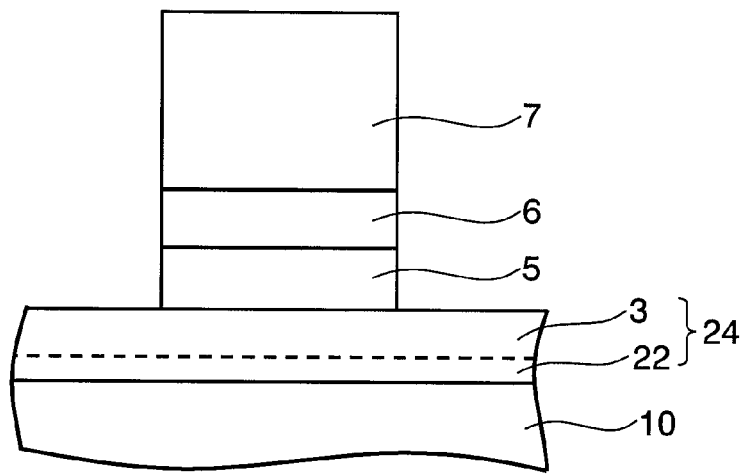

Then the floating electrode 5, the insulating film 6, and the control electrode 7 are patterned and etched using photolithography and dry etching techniques, and the structure shown in FIG. 8B is produced.

Figure 9A:
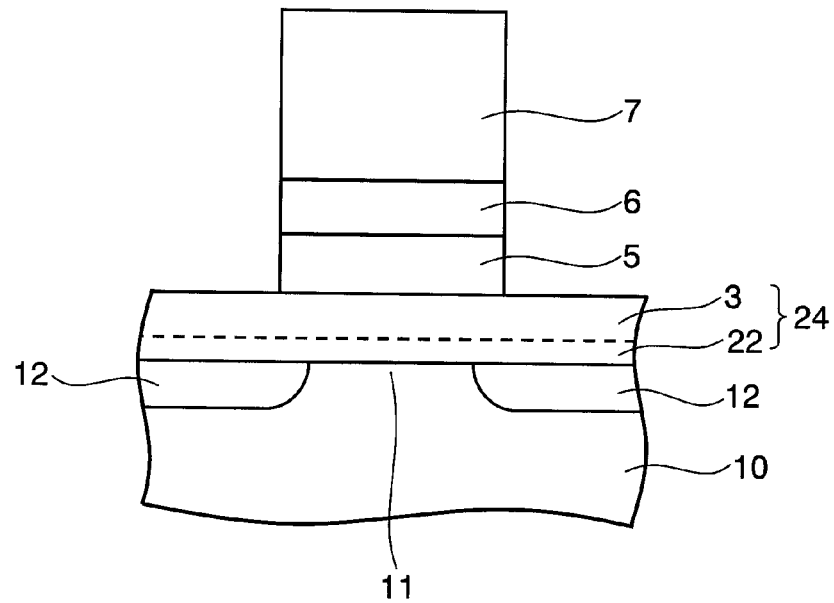
Figure 9B:
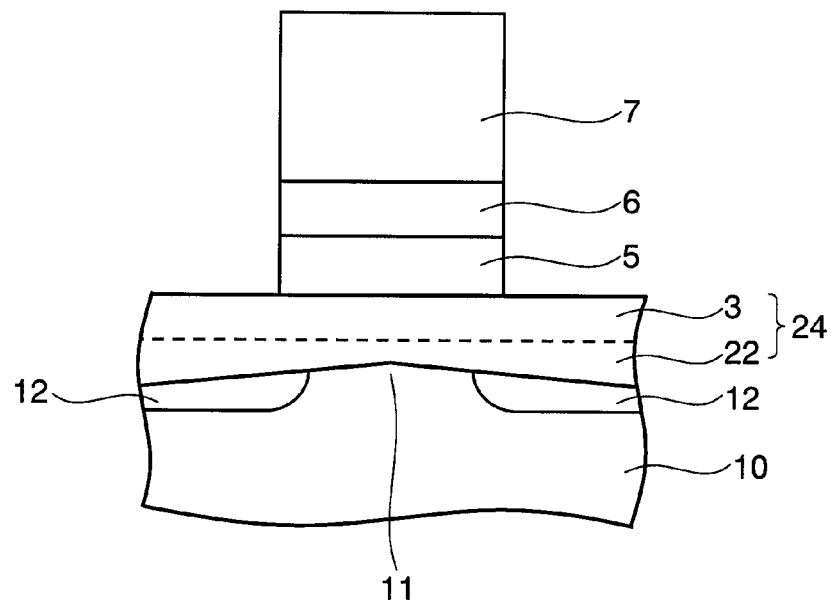

Next, the laminated structure of the floating electrode 5, the insulating film 6, and the control electrode 7 is used as a mask to perform ion implantation in the surface portion of the semiconductor layer 10. Thus, as shown in FIG. 9A, a dopant diffusion region 12 is selectively formed in the surface portion of the semiconductor layer 10.

Then heat treatment is performed at 1100° C. under oxygen atmosphere, for example. Here, relative to the channel formation region 11 masked with the laminated structure of the floating electrode 5, the insulating film 6, and the control electrode 7, the edge of the channel formation region 11 on the dopant diffusion region 12 side is further oxidized. Thus the interface between the dopant diffusion region 12 and the tunnel insulating film 24 moves to the semiconductor layer 10 (silicon substrate) side, and germanium in the tunnel insulating film on the edge side of the channel formation region is diffused. Consequently, the concentration of germanium element in the tunnel insulating film 24 decreases from the center toward the edge (dopant diffusion region 12) of the channel formation region 11. The distance from the interface between the semiconductor layer 10 and the tunnel insulating film 24 to the position of maximum germanium element concentration in the tunnel insulating film 24 (the position indicated by the dashed line in the figure) increases from the center toward the edge (dopant diffusion region 12) of the channel formation region 11.

Figure 10:
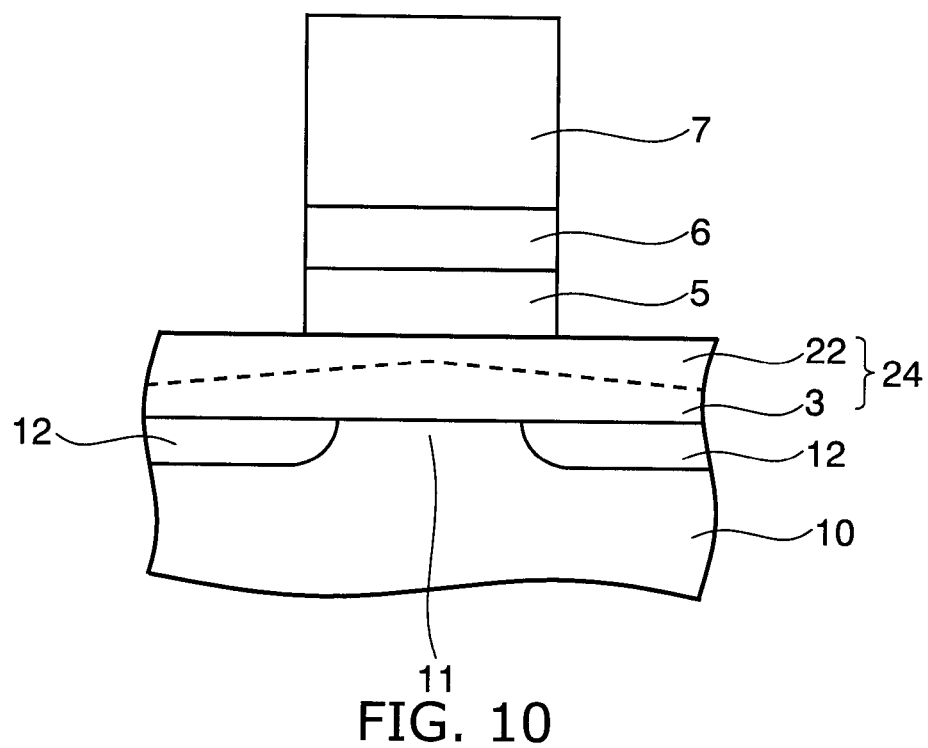
FIG. 10 shows another example of the tunnel insulating film of the nonvolatile semiconductor memory device.

FIG. 10 shows another example of the nonvolatile semiconductor memory device according to the second embodiment.

Germanium in the tunnel insulating film 24 distributes in a neighborhood of the interface between the tunnel insulating film 24 and the floating electrode 5. The concentration of germanium element in the tunnel insulating film 24 decreases from the center toward the edge (dopant diffusion region 12) of the channel formation region 11. For example, at the position of maximum germanium element concentration in the tunnel insulating film 24 (the position indicated by the dashed line in FIG. 10), the germanium element concentration is $10^{21}/cm^3$ above the center of the channel formation region 11 and $10^{20}/cm^3$ above the edge (dopant diffusion region 12) of the channel formation region 11.

The distance from the interface between the tunnel insulating film 24 and the floating electrode 5 to the position of maximum germanium element concentration in the tunnel insulating film 24 (the position indicated by the dashed line in FIG. 10) increases from the center toward the edge (dopant diffusion region 12) of the channel formation region 11. For example, the distance from the interface between the tunnel insulating film 24 and the floating electrode 5 at the center of the channel formation region 11 to the position of maximum germanium element concentration in the tunnel insulating film 24 is 2 nm. The distance from the interface between the tunnel insulating film 24 and the floating electrode 5 at the edge (dopant diffusion region 12) of the channel formation region 11 to the position of maximum germanium element concentration in the tunnel insulating film 24 is 3 nm.

In the band structure occurring in the structure of FIG. 10 at data erase time, electrons in the floating electrode 5 above the center of the channel formation region 11 are easy to migrate to the semiconductor layer 10 side through the assist level produced in the tunnel insulating film 24 above the center of the channel formation region 11, and electrons in the floating electrode 5 above the edge of the channel formation region 11 are easy to migrate to the semiconductor layer 10 side through the assist level produced in the tunnel insulating film 24 above the edge of the channel formation region 11. Hence the tunnel current density can be increased at both the center and the edge of the channel formation region 11, and the erase electric field can be accordingly reduced.

Furthermore, the germanium element concentration in the tunnel insulating film 24 in the neighborhood of the interface between the edge of the channel formation region 11 and the tunnel insulating film 24 is lower than the germanium element concentration in the tunnel insulating film 24 in the neighborhood of the interface between the center of the channel formation region 11 and the tunnel insulating film 24. Hence electron trap at the edge of the channel formation region prone to electric field concentration can be reduced at erase time, and reliability can be enhanced.

Moreover, the structure of FIG. 5 may be combined with the structure of FIG. 10 so that germanium in the tunnel insulating film 24 distributes both in a neighborhood of the interface between the semiconductor layer 10 and the tunnel insulating film 24 and in a neighborhood of the interface between the tunnel insulating film 24 and the floating electrode 5. In this structure, the concentration of germanium element in the tunnel insulating film 24 decreases from the center toward the edge of the channel formation region 11. Furthermore, the distance from the interface between the semiconductor layer 10 and the tunnel insulating film 24 to the position of maximum germanium element concentration in the tunnel insulating film 24 increases from the center toward the edge of the channel formation region 11, and the distance from the interface between the tunnel insulating film 24 and the floating electrode 5 to the position of maximum germanium element concentration in the tunnel insulating film 24 increases from the center toward the edge of the channel formation region 11.

In this structure, at write time and erase time, the tunnel current density can be increased at both the center and the edge of the channel formation region 11, and the write electric field and the erase electric field can be reduced. Furthermore, at write time and erase time, electron trap at the edge of the channel formation region 11 can be reduced.

Third Embodiment

Figure 11:
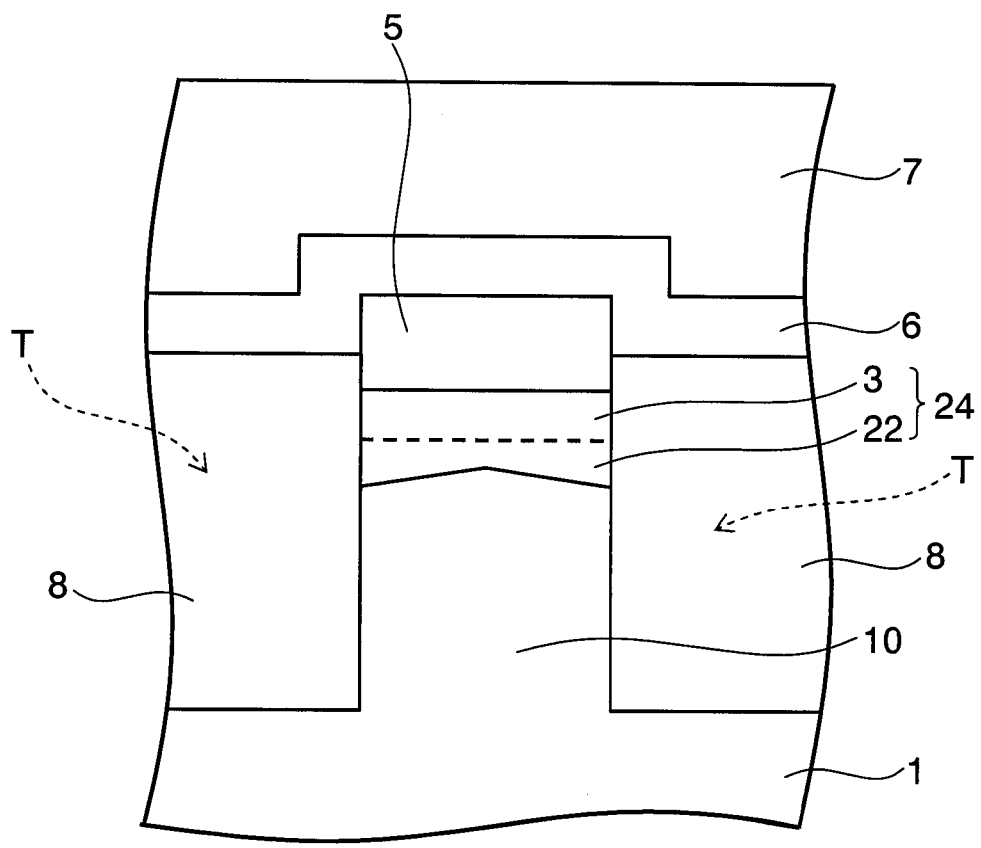
FIG. 11 is a schematic cross-sectional view illustrating the cross-sectional structure along the word line of the main part of a nonvolatile semiconductor memory device according to a third embodiment of the invention.

FIG. 11 is a schematic cross-sectional view illustrating the cross-sectional structure along the word line of the main part of a nonvolatile semiconductor memory device according to a third embodiment of the invention.

Also in this embodiment, the tunnel insulating film 24 contains silicon, germanium, and oxygen. Germanium in the tunnel insulating film 24 distributes in a neighborhood of the interface between the semiconductor layer 10 and the tunnel insulating film 24.

The concentration of germanium element in the tunnel insulating film 24 decreases from the center toward the edge of the semiconductor layer 10 along the word line, the semiconductor layer 10 being insulatively isolated from its adjacent semiconductor layer 10 along the word line by the device isolation insulating layer 8. For example, at the position of maximum germanium element concentration in the tunnel insulating film 24 (the position indicated by the dashed line in FIG. 11), the germanium element concentration is $10^{21}/cm^3$ above the center of the semiconductor layer 10 along the word line and $10^{20}/cm^3$ above the edge of the semiconductor layer 10 along the word line.

The distance from the interface between the semiconductor layer 10 and the tunnel insulating film 24 to the position of maximum germanium element concentration in the tunnel insulating film 24 (the position indicated by the dashed line in FIG. 11) increases from the center toward the edge of the semiconductor layer 10 along the word line. For example, the distance from the interface between the semiconductor layer 10 and the tunnel insulating film 24 at the center of the semiconductor layer 10 along the word line to the position of maximum germanium element concentration in the tunnel insulating film 24 is 2 nm. The distance from the interface between the semiconductor layer 10 and the tunnel insulating film 24 at the edge of the semiconductor layer 10 along the word line to the position of maximum germanium element concentration in the tunnel insulating film 24 is 3 nm.

According to this embodiment, charge trap levels (charge assist levels), which are shallow energy levels produced by germanium, exist in a neighborhood of the interface in the tunnel insulating film 24 between the semiconductor layer 10 and the tunnel insulating film 24. More specifically, levels assisting the migration of electrons injected from the semiconductor layer 10 side exist in a neighborhood of the interface in the tunnel insulating film 24 between the semiconductor layer 10 and the tunnel insulating film 24. These levels enhance, at data write time, the injection efficiency of electrons injected from the semiconductor layer 10 side through the tunnel insulating film 24 into the floating electrode 5. Consequently, the tunnel current density can be increased, the write electric field can be accordingly reduced, and reliability can be enhanced.

Furthermore, the germanium element concentration in the tunnel insulating film 24 in the neighborhood of the interface between the edge of the semiconductor layer 10 along the word line and the tunnel insulating film 24 is lower than the germanium element concentration in the tunnel insulating film 24 in the neighborhood of the interface between the center of the semiconductor layer 10 along the word line and the tunnel insulating film 24. Hence electron trap at the edge responsible for decreased reliability can be reduced.

FIGS. 12 and 13 are process cross-sectional views illustrating the main part of a process of manufacturing the nonvolatile semiconductor memory device according to this embodiment.

Figure 12A:
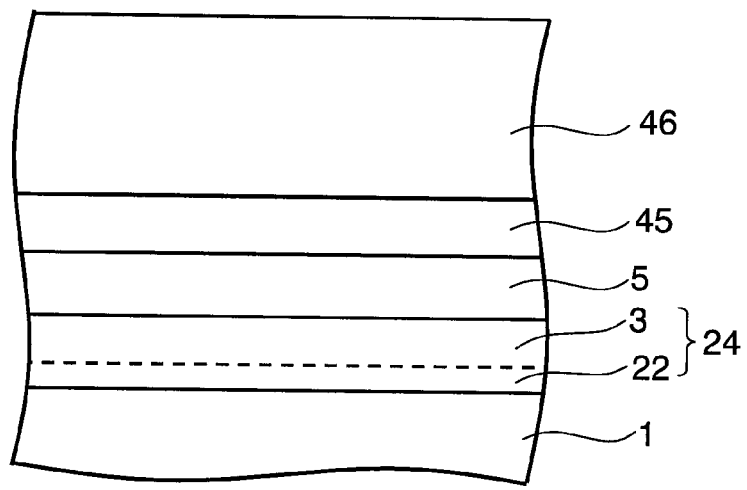
FIGS. 12 and 13 are process cross-sectional views illustrating the main part of a process of manufacturing the nonvolatile semiconductor memory device.

As shown in FIG. 12A, a silicon oxide film 3 is formed on a semiconductor substrate 1 made of p-type silicon by thermal oxidation, for example. Then germanium is introduced into the silicon oxide film 3 by ion implantation, for example. The ion implantation energy is controlled so that the distribution of germanium immediately after introduction into the silicon oxide film 3 has a maximum concentration in a range within 4 nm from the interface between the semiconductor layer 10 and the silicon oxide film 3.

Next, germanium in the silicon oxide film 3 is oxidized by heat treatment under oxidizing atmosphere. Thus a tunnel insulating film 24 having a region 22 containing silicon, germanium, and oxygen is produced in the silicon oxide film 3.

Figure 12B:
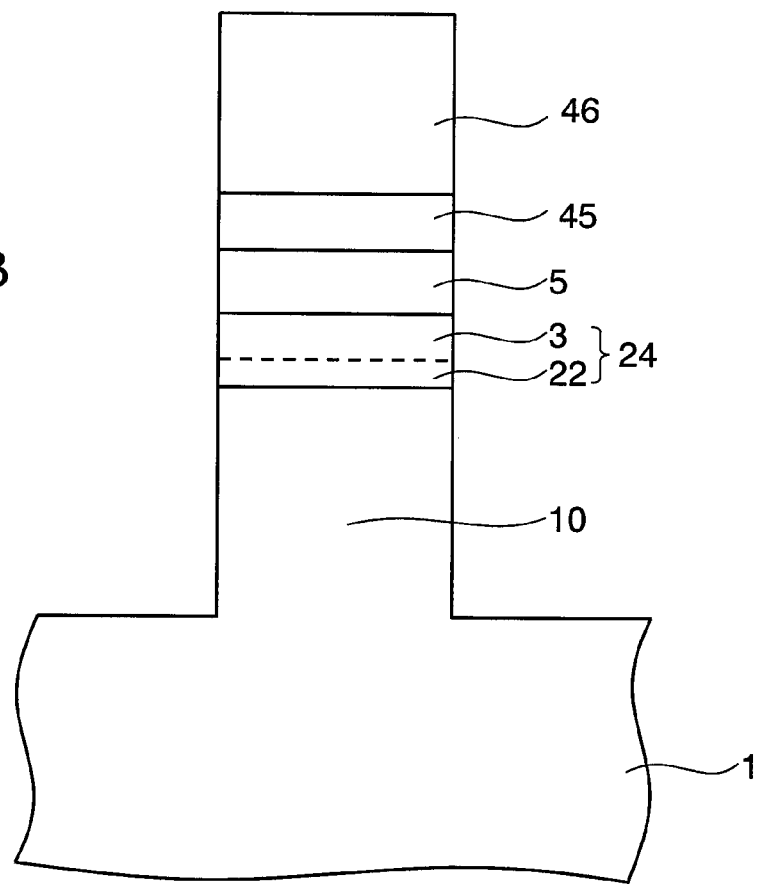

Then a floating electrode 5, a silicon nitride film 45, and a silicon oxide film 46 are formed sequentially on the tunnel insulating film 24. Then the silicon oxide film 46, the silicon nitride film 45, the floating electrode 5, the tunnel insulating film 24, and the semiconductor substrate 1 are etched using photolithography and dry etching techniques to form grooves for device isolation as shown in FIG. 12B.

Figure 13A:
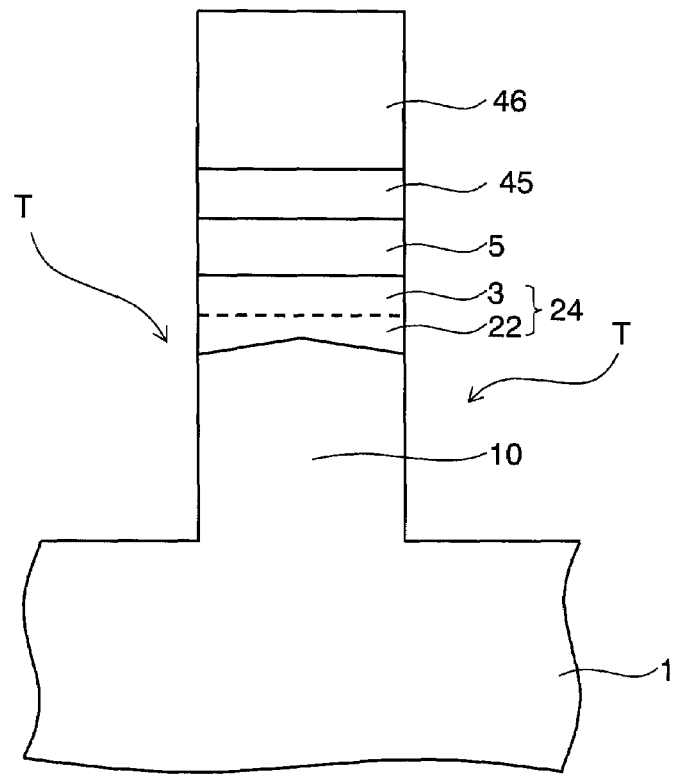
Figure 13B:
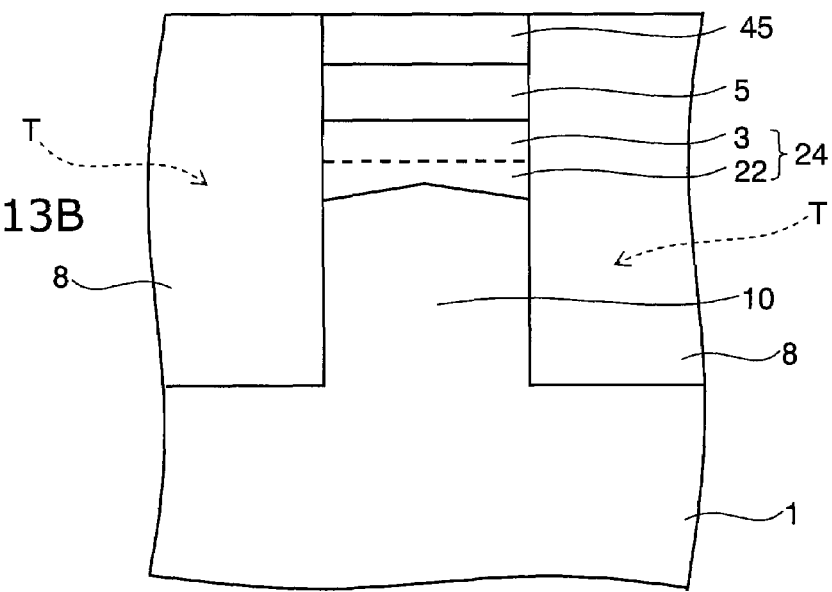

After the above etching, in order to recover etching damage and to oxidize the edge of the interface between the semiconductor layer 10 and the tunnel insulating film 24, heat treatment is performed in oxidizing atmosphere, which results in a structure shown in FIG. 13A. During this oxidation treatment, the interface between the edge of the semiconductor layer 10 along the word line and the tunnel insulating film 24 moves to the silicon substrate 1 side, and germanium in the tunnel insulating film on the edge side of the semiconductor layer 10 along the word line is diffused. Consequently, the concentration of germanium element in the tunnel insulating film 24 decreases from the center toward the edge of the semiconductor layer 10 along the word line. The distance from the interface between the semiconductor layer 10 and the tunnel insulating film 24 to the position of maximum germanium element concentration in the tunnel insulating film 24 (the position indicated by the dashed line in the figure) increases from the center toward the edge of the semiconductor layer 10 along the word line.

Next, a device isolation insulating layer 8 illustratively made of silicon oxide is buried in the device isolation groove (trench T), and then planarized by chemical mechanical polishing. This results in a structure shown in FIG. 13B.

Next, the device isolation insulating layer 8 is partially removed so that the surface of the device isolation insulating layer 8 is located at about half the film thickness of the floating electrode 5. Next, the silicon nitride film 45 is removed, and an insulating film 6 and a control electrode 7 are formed sequentially on the floating electrode 5. This results in the structure shown in FIG. 11.

Here, alternatively, germanium in the tunnel insulating film 24 may be distributed in a neighborhood of the interface between the tunnel insulating film 24 and the floating electrode 5, and the concentration of germanium element in the tunnel insulating film 24 may be configured to decrease from the center toward the edge of the semiconductor layer 10 along the word line. In this case, for example, at the position of maximum germanium element concentration in the tunnel insulating film 24, the germanium element concentration can be set to $10^{21}/cm^3$ above the center of the semiconductor layer 10 along the word line and $10^{20}/cm^3$ above the edge of the semiconductor layer 10 along the word line.

The distance from the interface between the tunnel insulating film 24 and the floating electrode 5 to the position of maximum germanium element concentration in the tunnel insulating film 24 can be increased from the center toward the edge of the semiconductor layer 10 along the word line. For example, the distance from the interface between the tunnel insulating film 24 and the floating electrode 5 at the center of the semiconductor layer 10 along the word line to the position of maximum germanium element concentration in the tunnel insulating film 24 can be set to 2 nm, and the distance from the interface between the tunnel insulating film 24 and the floating electrode 5 at the edge of the semiconductor layer 10 along the word line to the position of maximum germanium element concentration in the tunnel insulating film 24 can be set to 3 nm.

In the above structure, charge trap levels (charge assist levels), which are shallow energy levels produced by germanium, exist in a neighborhood of the interface in the tunnel insulating film 24 between the tunnel insulating film 24 and the floating electrode 5. More specifically, levels assisting the migration of electrons injected (ejected) from the floating electrode 5 side exist in a neighborhood of the interface in the tunnel insulating film 24 between the tunnel insulating film 24 and the floating electrode 5. These levels enhance, at erase time, the migration efficiency of electrons injected (ejected) from the floating electrode 5 side through the tunnel insulating film 24 into the semiconductor layer 10. Consequently, the tunnel current density can be increased, the erase electric field can be accordingly reduced, and reliability can be enhanced.

Moreover, the structure may be configured so that germanium in the tunnel insulating film 24 distributes both in a neighborhood of the interface between the semiconductor layer 10 and the tunnel insulating film 24 and in a neighborhood of the interface between the tunnel insulating film 24 and the floating electrode 5. In this structure, the concentration of germanium element in the tunnel insulating film 24 decreases from the center toward the edge of the semiconductor layer 10 along the word line. Furthermore, the distance from the interface between the semiconductor layer 10 and the tunnel insulating film 24 to the position of maximum germanium element concentration in the tunnel insulating film 24 increases from the center toward the edge of the semiconductor layer 10 along the word line, and the distance from the interface between the tunnel insulating film 24 and the floating electrode 5 to the position of maximum germanium element concentration in the tunnel insulating film 24 increases from the center toward the edge of the semiconductor layer 10 along the word line.

In this structure, at write time and erase time, the tunnel current density can be increased at both the center and the edge of the semiconductor layer 10 along the word line, and the write electric field and the erase electric field can be reduced. Furthermore, electron trap at the edge responsible for decreased reliability can be reduced.

Fourth Embodiment

FIG. 14 is a process cross-sectional view illustrating the main part of a process of manufacturing a nonvolatile semiconductor memory device according to a fourth embodiment of the invention.

Figure 14A:
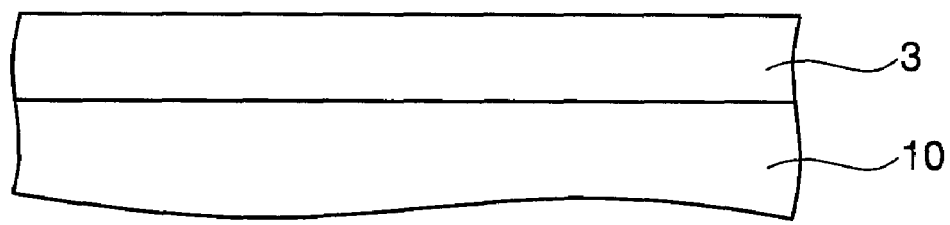
FIG. 14 is a process cross-sectional view illustrating the main part of a process of manufacturing a nonvolatile semiconductor memory device according to a fourth embodiment of the invention.

As shown in FIG. 14A, a silicon oxide film 3 of about 15 nm is formed on a semiconductor layer 10 of p-type silicon by thermal oxidation, for example.

Figure 14B:
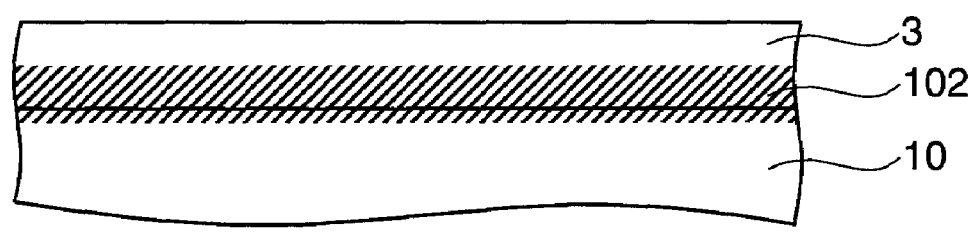

Subsequently, as shown in FIG. 14B, germanium is introduced into the silicon oxide film 3 by ion implantation, for example. The acceleration voltage is set to 15 keV and the dose amount is set to $1 \times 10^{15}/cm^2$, for example, so that the distribution of germanium immediately after introduction into the silicon oxide film 3 has a maximum concentration (e.g. $10^{21}/cm^3$) in a range within 4 nm from the interface between the semiconductor layer 10 and the silicon oxide film 3 and that germanium is implanted also into the surface portion of the semiconductor layer 10. In FIG. 14B, the distribution region 102 of germanium immediately after introduction is hatched.

Figure 14C:
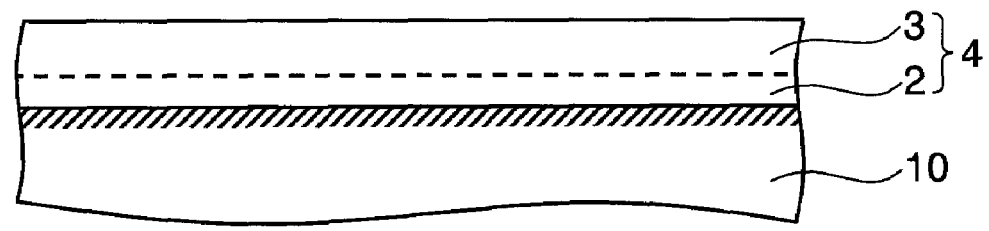

Next, heat treatment is performed at 1050° C. under oxygen atmosphere, for example, to oxidize germanium in the silicon oxide film 3. Thus a tunnel insulating film 4 having a region 2 containing silicon, germanium, and oxygen is produced in the silicon oxide film 3 as shown in FIG. 14C.

Also in this embodiment, the tunnel insulating film 4 contains germanium in a region within 4 nm from the interface between the semiconductor layer 10 and the tunnel insulating film 4, and charge assist levels, which are shallow energy levels produced by germanium, are formed in a neighborhood of the interface between the semiconductor layer 10 and the tunnel insulating film 4. These levels enhance, at write time, the injection efficiency of electrons injected from the semiconductor layer 10 side. Thus the write electric field can be reduced.

Furthermore, because germanium introduced by ion implantation remains in the surface portion of the semiconductor layer 10, the germanium forms strained silicon in the surface portion of the semiconductor layer 10. Hence the carrier mobility is enhanced.

The film thickness of the silicon oxide film 3 and the acceleration voltage for ion implantation are not limited to the above values, but can be controlled so that the germanium distribution has its maximum concentration at a desired position.

For example, when the silicon oxide film 3 has a thickness of about 5 nm, germanium can be distributed in a neighborhood of the interface between the semiconductor layer 10 and the tunnel insulating film 4 by implantation at an acceleration voltage of 2 keV.

For example, a germanium distribution having a maximum concentration in the silicon oxide film 3 at 2 nm from the surface of the silicon oxide film 3 can be formed by implantation at an acceleration voltage of 300 eV.

A germanium concentration distribution having two or more peaks in the silicon oxide film 3 can be formed by ion implantation at two or more different acceleration voltages. For example, for the silicon oxide film 3 having a thickness of about 10 nm, a germanium distribution having maximum concentrations at the surface of the semiconductor layer 10 and at a position of 2 nm from the surface of the silicon oxide film 3, respectively, can be formed by first implantation at an acceleration voltage of 8 keV followed by implantation at an acceleration voltage of 500 eV.

The dose amount is not limited to $1 \times 10^{15}/cm^2$. For example, the number of charge assist levels can be decreased by setting the dose amount to $5 \times 10^{14}/cm^2$. The number of charge assist levels can be increased by setting the dose amount to $1 \times 10^{16}/cm^2$.

The heat treatment condition for oxidizing germanium is not limited to 1050° C. under oxygen atmosphere. The heat treatment can be performed at any temperatures of 300° C. or more, for example. The oxidizing atmosphere can be any atmosphere containing at least one of oxygen ion, ozone, oxygen radical, water, hydroxide ion, and hydroxyl radical. Preferably, the above heat treatment condition is 400° C. under oxygen radical atmosphere. This is because thermal oxidation at 800° C. or more oxidizes the silicon substrate interface and causes film growth, thereby shifting the maximum concentration position of germanium formed by ion implantation. Furthermore, germanium is thermally diffused, and the maximum concentration decreases. Hence it is preferable to use oxygen radical atmosphere, which enables low temperature oxidation.

In the cross-sectional structure along the word line shown in FIG. 2, germanium may be implanted into the silicon oxide film on the semiconductor layer 10 to form a tunnel insulating film 4 containing silicon, germanium, and oxygen before the device isolation insulating layer 8 is formed. Alternatively, germanium may be implanted into the silicon oxide film on the semiconductor layer 10 to form a tunnel insulating film 4 containing silicon, germanium, and oxygen after the device isolation insulating layer 8 is formed.

When the device isolation insulating layer 8 is formed before implantation of germanium, germanium is introduced also into the device isolation insulating layer 8 by this ion implantation. This results in a structure, as shown in FIGS. 15 and 16, where germanium exists in the surface of the device isolation insulating layer 8.

Figure 15:
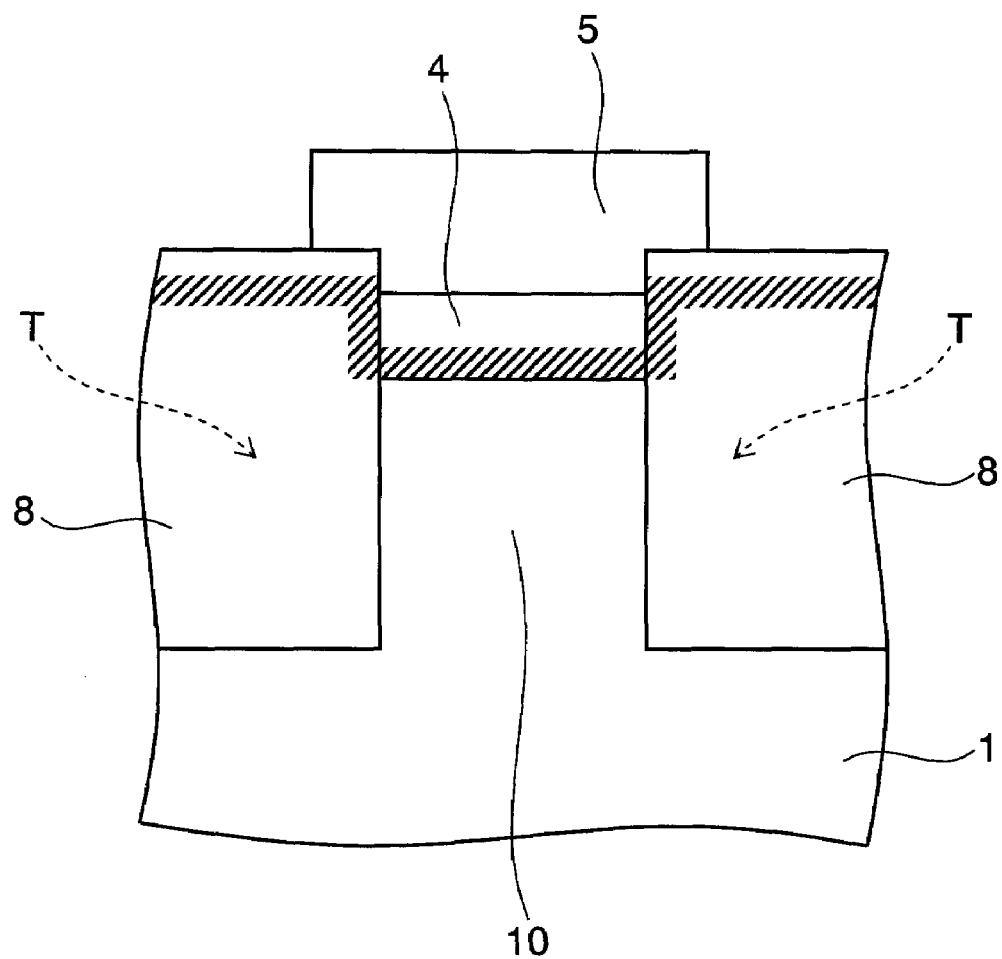
FIG. 15 is a cross-sectional view showing another example of the nonvolatile semiconductor memory device.

FIG. 15 shows a structure where the surface of the device isolation insulating layer 8 protrudes from the surface of the tunnel insulating film 4 (the interface between the tunnel insulating film 4 and the floating electrode 5).

Figure 16:
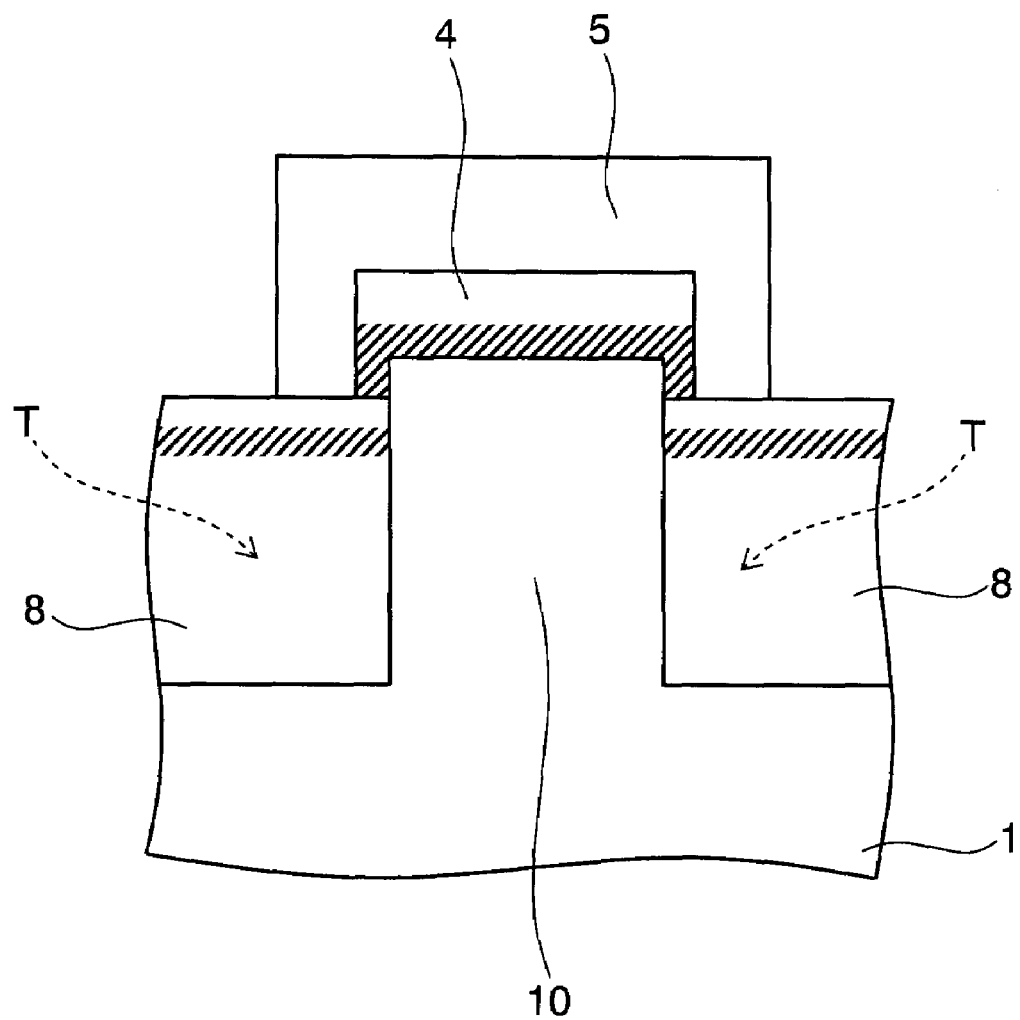
FIG. 16 is a cross-sectional view showing still another example of the nonvolatile semiconductor memory device.

FIG. 16 shows a structure where the surface of the tunnel insulating film 4 protrudes from the surface of the device isolation insulating layer 8.

Fifth Embodiment

FIG. 17 is a process cross-sectional view illustrating the main part of a process of manufacturing a nonvolatile semiconductor memory device according to a fifth embodiment of the invention.

Figure 17A:
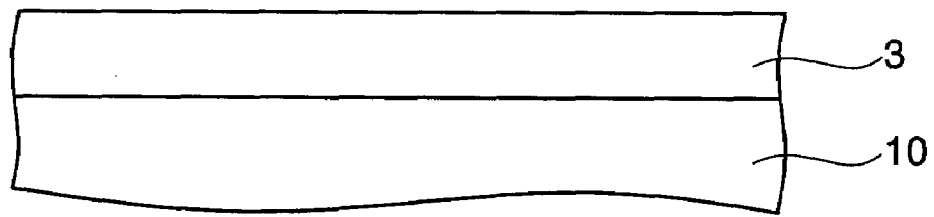
FIG. 17 is a process cross-sectional view illustrating the main part of a process of manufacturing a nonvolatile semiconductor memory device according to a fifth embodiment of the invention.
Figure 17B:
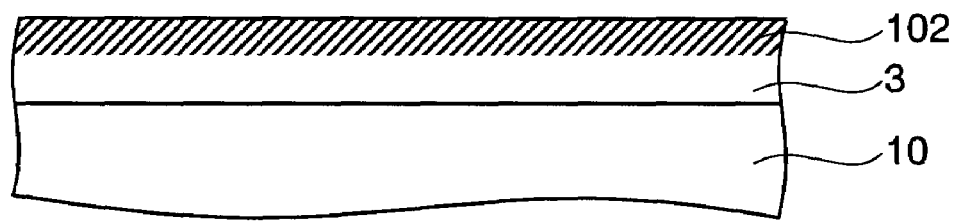

As shown in FIG. 17A, a silicon oxide film 3 of about 15 nm is formed on a semiconductor layer 10 of p-type silicon by thermal oxidation, for example.

Subsequently, heat treatment is performed using vapor phase diffusion under an atmosphere having a $GeH_4$ gas partial pressure of $1.333 \times 10^2$ Pa at a temperature of 900° C., for example, to introduce germanium into the silicon oxide film 3. The germanium distribution region 102, which is hatched in FIG. 17B, has a maximum concentration (e.g. $5 \times 10^{19}/cm^3$) in a range within 4 nm from the surface of the silicon oxide film 3. Ion implantation damage can be avoided by using vapor phase diffusion for introducing germanium into the silicon oxide film 3.

Figure 17C:
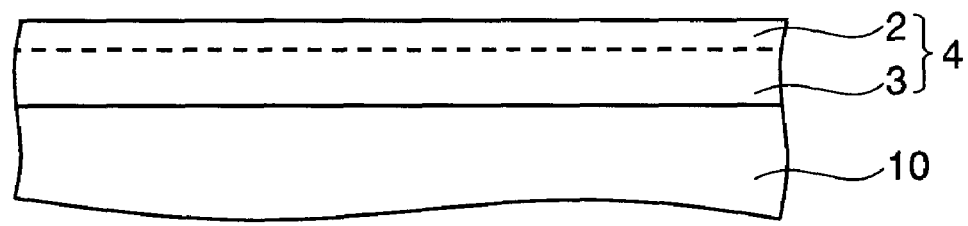

Next, heat treatment is performed at 850° C. under water atmosphere to oxidize germanium in the silicon oxide film 3. Thus, as shown in FIG. 17C, a tunnel insulating film 4 having a region 2 containing silicon, germanium, and oxygen is produced in the silicon oxide film 3.

In this embodiment, the tunnel insulating film 4 contains germanium in a region within 4 nm from the surface of the tunnel insulating film 4, and charge assist levels, which are shallow energy levels produced by germanium, are formed in a neighborhood of the surface of the tunnel insulating film 4 (a neighborhood of the interface with the floating electrode). These levels enhance, at erase time, the injection (ejection) efficiency of electrons injected (ejected) from the floating electrode side. Thus the erase electric field can be reduced.

Furthermore, vapor phase diffusion used for introducing germanium into the silicon oxide film 3 can avoid ion implantation damage, which is feared when ion implantation is used. Hence it is possible to reduce the increase of leak current caused by stress due to repeated write and erase.

The film thickness of the silicon oxide film 3 is not limited to the above value. For example, the film thickness of the silicon oxide film 3 may be set to about 8 nm.

The temperature of vapor phase diffusion is not limited to 900° C., but may be 800° C. or 1000° C., for example.

The germanium-containing gas, which is a raw material gas for vapor phase diffusion, is not limited to germanium hydride ($GeH_4$) gas, but may be germanium tetrachloride ($GeCl_4$) gas, for example.

The germanium-containing gas partial pressure is not limited to $1.333 \times 10^2$ Pa. For introducing germanium at higher concentration, the germanium-containing gas partial pressure may be $2.666 \times 10^4$ Pa. The maximum germanium concentration in this case is $10^{21}/cm^3$. For introducing germanium at lower concentration, the germanium-containing gas partial pressure may be 1.333 Pa. The maximum germanium concentration in this case is $10^{18}/cm^3$.

The heat treatment condition under oxidizing atmosphere is not limited to 850° C. under water atmosphere. The heat treatment can be performed at any temperatures of 300° C. or more. The oxidizing atmosphere can be any atmosphere containing at least one of oxygen, oxygen ion, ozone, oxygen radical, hydroxide ion, and hydroxyl radical. Use of low temperature and oxygen radical atmosphere is preferable. This is because high-temperature oxidation oxidizes the silicon substrate and causes film growth, thereby shifting the peak concentration position of germanium formed by ion implantation. Furthermore, germanium is thermally diffused, and the peak concentration decreases. Hence it is preferable to use oxygen radical atmosphere, which enables low temperature oxidation.

Sixth Embodiment

FIG. 18 is a process cross-sectional view illustrating the main part of a process of manufacturing a nonvolatile semiconductor memory device according to a sixth embodiment of the invention.

Figure 18A:
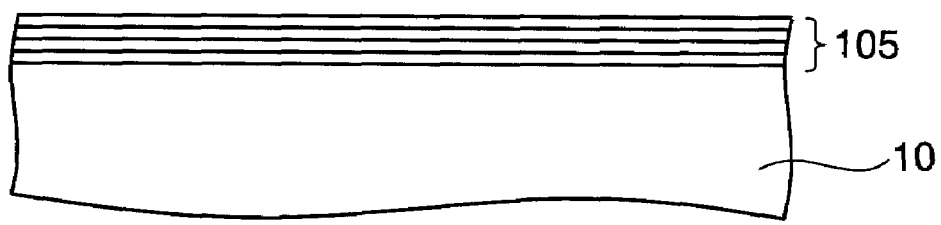
FIG. 18 is a process cross-sectional view illustrating the main part of a process of manufacturing a nonvolatile semiconductor memory device according to a sixth embodiment of the invention.

As shown in FIG. 18A, chemical vapor deposition (CVD), for example, is used to form a region 105 containing silicon, germanium, and oxygen within a range of 4 nm from the surface of a semiconductor layer 10. For example, a silicon-containing source gas (e.g. silane ($SiH_4$) gas), a germanium-containing source gas (e.g. germanium hydride ($GeH_4$) gas), and an oxidizing gas (e.g. oxygen gas) are simultaneously introduced into a chamber containing a silicon substrate (semiconductor layer 10) to form a region 105 containing silicon, germanium, and oxygen.

Figure 18B:
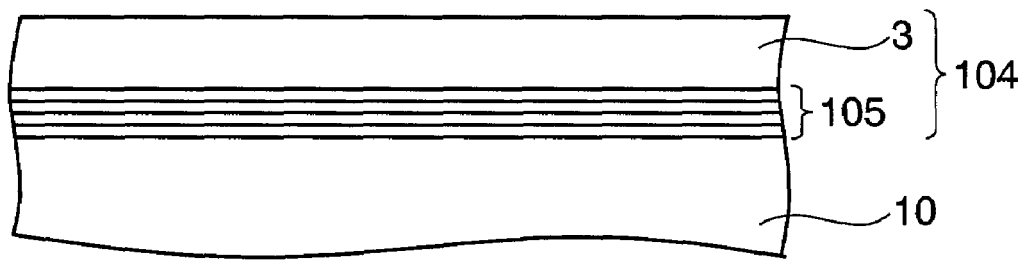
Figure 19:
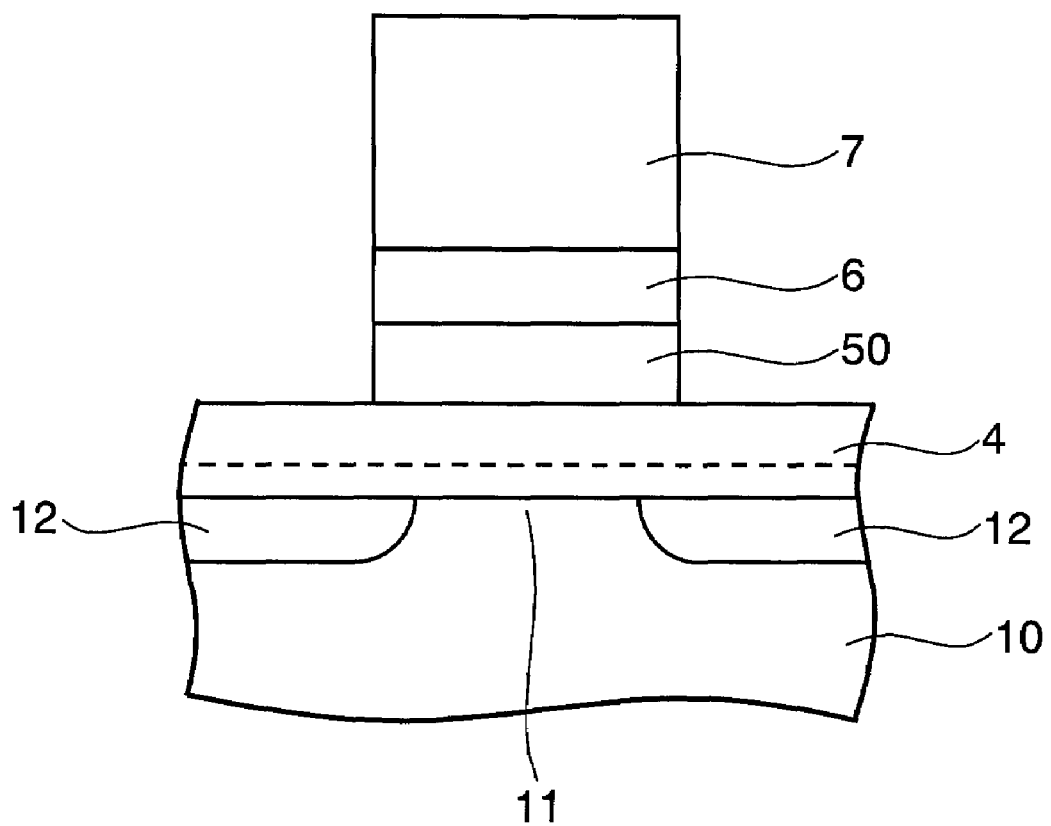
FIG. 19 is a schematic cross-sectional view illustrating the cross-sectional structure along the bit line of the main part of a nonvolatile semiconductor memory device according to another embodiment of the invention.

Next, introduction of the germanium-containing source gas is stopped. As shown in FIG. 18B, a silicon oxide film 3 is deposited on the region 105 containing silicon, germanium, and oxygen. The silicon oxide film 3 is deposited to a film thickness of e.g. 15 nm. After this deposition, heat treatment is performed at 1000° C. under oxidizing atmosphere, e.g. oxygen atmosphere, which results in a tunnel insulating film 104 containing silicon, germanium, and oxygen.

Also in this embodiment, the tunnel insulating film 104 contains germanium in a region within 4 nm from the interface between the semiconductor layer 10 and the tunnel insulating film 104, and charge assist levels, which are shallow energy levels produced by germanium, are formed in a neighborhood of the interface between the semiconductor layer 10 and the tunnel insulating film 104. These levels enhance, at write time, the injection efficiency of electrons injected from the semiconductor layer 10 side. Thus the write electric field can be reduced.

The film thickness of the tunnel insulating film 104 is not limited to the above value, but may be about 10 nm, for example.

The silicon-containing gas is not limited to silane gas, but may be disilane ($Si_2H_6$) gas, for example.

The germanium-containing gas is not limited to germanium hydride ($GeH_4$) gas, but may be germanium tetrachloride ($GeCl_4$) gas, for example.

The oxidizing gas is not limited to oxygen gas, but may be a gas containing at least one of oxygen ion, ozone, oxygen radical, water, hydroxide ion, and hydroxyl radical, for example.

In the above example, chemical vapor deposition is used to form a tunnel insulating film 104 containing silicon, germanium, and oxygen. However, it is also possible to use atomic layer deposition or molecular layer deposition. When atomic layer deposition or molecular layer deposition is used, a source gas containing silicon or germanium is introduced and adsorbed on the substrate surface. Next, the introduced source gas is ejected. Then an oxidizing gas is introduced to oxidize the source gas adsorbed on the substrate surface, thereby forming a silicon oxide film or germanium oxide film. Then the oxidizing gas is ejected. A silicon oxide film and a germanium oxide film can be formed by repeating the steps of introducing a source gas, ejecting the source gas, introducing an oxidizing gas, and ejecting the oxidizing gas. By using this method, the proportion of silicon oxide films and germanium oxide films can be controlled for each layer.

Embodiments of the invention have been described with reference to examples. However, the invention is not limited thereto, but may be variously modified within the scope of the invention.

In the structure of the above examples, a floating electrode 5 is used as a charge storage layer. However, the invention is not limited thereto, but may be also applicable to nonvolatile semiconductor memory devices having a MONOS (Metal/Oxide/Nitride/Oxide/Semiconductor) structure where a silicon nitride film 50 is used as a charge storage layer.

Furthermore, in the structure of the above examples, the insulating film between the charge supply layer (which illustratively corresponds to the semiconductor layer 10) and the charge storage layer (which illustratively corresponds to the floating electrode 5) contains silicon, germanium, and oxygen, and thereby the tunnel current in the insulating film increases. Use of the above structure also serves to enhance the injection efficiency of hot carriers, for example. However, it is contemplated that the invention is particularly advantageous to increasing the tunnel current.

What is claimed is:

1. A semiconductor device comprising:
a semiconductor layer having a channel formation region in its surface portion;
an insulating film provided on the semiconductor layer and containing silicon, germanium, and oxygen; and
a charge storage layer provided on the insulating film and being capable of storing charge supplied from the semiconductor layer through the insulating film,
wherein concentration of the germanium in the insulating film is maximized at at least one of a neighborhood of an interface between the semiconductor layer and the insulating film and a neighborhood of an interface between the insulating film and the charge storage layer, and
the concentration of germanium element in the insulating film decreases from a center toward an edge of the channel formation region in a direction parallel to the surface.

2. The semiconductor device according to claim 1, wherein germanium in the insulating film distributes in the neighborhood of the interface between the semiconductor layer and the insulating film.

3. The semiconductor device according to claim 1, wherein germanium in the insulating film distributes in the neighborhood of the interface between the insulating film and the charge storage layer.

4. The semiconductor device according to claim 1, wherein germanium in the insulating film distributes in the neighborhood of the interface between the semiconductor layer and the insulating film and in the neighborhood of the interface between the insulating film and the charge storage layer.

5. The semiconductor device according to claim 1, wherein the insulating film has a laminated structure of a first insulating layer containing silicon, germanium, and oxygen and a second insulating layer having a dielectric constant of not less than that of silicon nitride.

6. The semiconductor device according to claim 1, wherein the insulating film has a laminated structure where first insulating layers containing silicon, germanium, and oxygen sandwich a second insulating layer having a dielectric constant of not less than that of silicon nitride in its thickness direction.

7. The semiconductor device according to claim 1, wherein four oxygen atoms are bonded to one germanium atom in the insulating film.

8. The semiconductor device according to claim 1, wherein three or less oxygen atoms are bonded to one germanium atom in the insulating film.

9. The semiconductor device according to claim 1, wherein the distance from the interface between the semiconductor layer and the insulating film to the position of maximum germanium element concentration in the insulating film increases from the center toward the edge of the channel formation region.

10. The semiconductor device according to claim 1, wherein the distance from the interface between the insulating film and the charge storage layer to the position of maximum germanium element concentration in the insulating film increases from the center toward the edge of the channel formation region.

11. A semiconductor device comprising:
a semiconductor layer having a channel formation region in its surface portion;
an insulating film provided on the semiconductor layer and containing silicon, germanium, and oxygen; and
a charge storage layer provided on the insulating film and being capable of storing charge supplied from the semiconductor layer through the insulating film,
wherein the concentration of germanium element in the insulating film decreases from a center toward an edge of the channel formation region in a direction parallel to the surface.

12. The semiconductor device according to claim 11, wherein the distance from the interface between the semiconductor layer and the insulating film to the position of maximum germanium element concentration in the insulating film increases from the center toward the edge of the channel formation region.

13. The semiconductor device according to claim 11, wherein the distance from the interface between the insulating film and the charge storage layer to the position of maximum germanium element concentration in the insulating film increases from the center toward the edge of the channel formation region.

14. The semiconductor device according to claim 11, wherein four oxygen atoms are bonded to one germanium atom in the insulating film.

15. The semiconductor device according to claim 11, wherein three or less oxygen atoms are bonded to one germanium atom in the insulating film.

* * * * *